(12) United States Patent
List et al.

(10) Patent No.: US 7,893,481 B2
(45) Date of Patent: Feb. 22, 2011

(54) TOP ELECTRODE BARRIER FOR ON-CHIP DIE DE-COUPLING CAPACITOR AND METHOD OF MAKING SAME

(75) Inventors: Richard Scott List, Beaverton, OR (US); Bruce A. Block, Portland, OR (US); Ruitao Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/823,704

(22) Filed: Jun. 26, 2007

(65) Prior Publication Data

US 2007/0252187 A1   Nov. 1, 2007

Related U.S. Application Data

(62) Division of application No. 09/962,786, filed on Sep. 24, 2001, now Pat. No. 7,256,089.

(51) Int. Cl.
*H01L 29/76* (2006.01)
*H01L 29/94* (2006.01)

(52) U.S. Cl. ........................... 257/306; 257/310

(58) Field of Classification Search ............. 257/303, 257/306, 307, 310, E21.021, E27.048
See application file for complete search history.

(56) References Cited

U.S. PATENT DOCUMENTS

| | | | |
|---|---|---|---|
| 5,976,928 A | 11/1999 | Kirlin et al. | |
| 6,027,980 A | 2/2000 | Gardner | |
| 6,180,482 B1 | 1/2001 | Kang | |
| 6,278,147 B1 | 8/2001 | Dalton et al. | |
| 6,297,527 B1 | 10/2001 | Agarwai et al. | |
| 6,339,258 B1 | 1/2002 | Cooney, III et al. | |
| 6,451,665 B1 * | 9/2002 | Yunogami et al. | 438/397 |
| 6,734,477 B2 * | 5/2004 | Moise et al. | 257/295 |
| 6,737,728 B1 * | 5/2004 | Block et al. | 257/532 |

OTHER PUBLICATIONS

Hiroyuki Shimada, Ichiro Ohshima, Shin-Ichi Nakao, Munekatsu Nakagawa, Kei Kanemoto, Masaki Hirayama, Shigetoshi Sugawa, and Tadahiro Ohmi, "Low Resistivity bcc-Ta/TaNx Metal Gate MNSFETs Having Plane Gate Structure Featuring Fully Low-Temperature Processing below 450° C.," Digest of Technical Papers, Symposium on VLSI Technology, Jun. 13, 2001, pp. 67-68.
S,M. Size, "Physics of Semiconductor Devices," John Wiley & Sons, New York (1981), Appendix 1.

(Continued)

*Primary Examiner*—Hung Vu
(74) *Attorney, Agent, or Firm*—Blakely, Sokoloff, Taylor & Zafman LLP

(57) ABSTRACT

An improvement in the method of fabricating on chip decoupling capacitors which help prevent L di/dt voltage droop on the power grid for high surge current conditions is disclosed. The inclusion of a hybrid metal/metal nitride top electrode/barrier provides for a low cost and higher performance option to strapping decoupling capacitors.

20 Claims, 3 Drawing Sheets

OTHER PUBLICATIONS

S. Wolf, "Silicon Processing for the VLSI Era, vol. 4—Deep Submicron Process Technology," Lattice Press, Sunset Beach, CA (2002) p. 270.

Hiroyuki Shimada, IshiroOshima, Takeo Ushiki, Shigetoshi Sugawa and Tadahiro, Tantalum Nitride Metal Gate FD-SOI CMOSFETs Using Low Resistivity Self-Grown bcc-Tantalum Layer, IEEE Trans. on Electron Devices, vol. 48 (Aug. 2001) pp. 1619-1627.

S.C. Sun, M.H. Tsai, and H.T. Chiu, "Properties of Metalorganic Chemical Vapor Deposited Tantalum Nitride Thin Films," Proc. 4th International Conference on Solid State and Integrated Circuit Tech. (1995), pp. 547-549.

Non final Rejection mailed Mar. 3, 2004; U.S. Appl. No. 09/962,786.
Non final Rejection mailed May 8, 2003; U.S. Appl. No. 09/962,786.
Non final Rejection mailed Dec. 11, 2002; U.S. Appl. No. 09/962,786.
Non final Rejection mailed Jul. 17, 2002; U.S. Appl. No. 09/962,786.
Final Rejection mailed Jul. 28, 2004; U.S. Appl. No. 09/962,786.
Final Rejection mailed Oct. 17, 2003; U.S. Appl. No. 09/962,786.
Wilson, et al., "Handbook of Multilevel Metallization for Integrated Circuits", *Noyes Publ.*, Westwood, new jersey, (1993), 42.

* cited by examiner

US 7,893,481 B2

TOP ELECTRODE BARRIER FOR ON-CHIP DIE DE-COUPLING CAPACITOR AND METHOD OF MAKING SAME

CROSS REFERENCE TO RELATED APPLICATION

This application is a divisional patent application of U.S. patent application Ser. No. 09/962,786 filed Sep. 24, 2001 entitled, "Top Electrode Barrier for On-Chip Die De-Coupling Capacitor and Method of Making Same" issued as U.S. Pat. No. 7,256,089 on Aug. 14, 2007.

BACKGROUND OF THE INVENTION

1. Field of the Invention.

The invention relates to integrated circuit decoupling capacitors.

2. Brief Description of Related Art.

The operation of high power, high speed integrated circuits can be affected by the electrical noise generated by the instantaneous switching of the transistors located in the circuit. It is well known that the inductive noise of an integrated circuit can be reduced by connecting decoupling capacitors to the circuit. Decoupling capacitors placed on power grids with current surges are able to smooth out voltage variations with current supplied from the stored charge on the decoupling capacitor.

Typically, a decoupling capacitor is placed on the opposite side of the package from the chip. Unfortunately, this arrangement is costly to manufacture, and the long lead lines from the power-consuming circuit to the capacitor electrodes contribute to an unacceptably high inductance. Such off-chip decoupling capacitors, however, are not sufficient for very high speed microprocessor applications. Since the decoupling capacitors are located at a relatively long distance from the switching circuits, the voltage droop caused by the high inductance path makes the off-chip capacitors unusable with gigahertz switching circuits. The voltage droop across an inductor is equal to L di/dt, where L is inductance and di/dt represents the change in current through a circuit over a period of time. Implicit in the di/dt is a frequency term omega, so as frequency goes up, inductive voltage droop becomes a larger part of the equation for power distribution. At very low frequencies, the only contributing impedance is the resistive voltage droop equal to iR, which is independent of frequency. At very low frequencies, power distribution is dominated by resistance.

Efforts have been made to integrate decoupling capacitors as part of the gate dielectric processing step. A portion of the chip is used to deposit the gate dielectric for use at the decoupling capacitor. An advantage to this is that there are no additional processing steps involved with fabricating the decoupling capacitor while using the gate dielectric. The disadvantages include the decoupling capacitor takes up high-value real estate on the chip as the capacitors compete for valuable die area that could be used for building additional circuits. Also when the capacitor is made with the gate oxide designed for very high transistor performance, there is a great deal of leakage. Although it is possible to integrate chip capacitors within the chip's circuit elements, due to limited area in which to build these capacitors, the overall capacitive decoupling that they provide is also limited.

Another approach to decoupling capacitor fabrication is illustrated in FIG. 1. FIG. 1 illustrates a decoupling capacitor that may be fabricated on top of a metal line in an integrated circuit. In one embodiment, the metal layer comprises $V_{cc}$ 35 and $V_{ss}$ 30. On top of $V_{cc}$ line 35 is a decoupling capacitor stack comprising lower electrode 18, capacitor material 16 of a generally high dielectric constant, and top electrode 14, the whole of which is passivated by a global layer of silicon nitride 20. Surrounding all metal lines in these metal layers is interlayer dielectric (ILD) 10 that is usually a Plasma Tetra Ethyl Ortho Silicate (PTEOS) oxide. FIG. 1 shows a $V_{ss}$ 30 coupled through an opening in passivation layer 20 through a decoupling capacitor stack 18, 16, and 14 to metal $V_{cc}$ 35. This figure forms a decoupling capacitor between $V_{cc}$ line 35 and $V_{ss}$ line 30. The advantages to this embodiment are that no additional real estate on the chip is taken up for fabrication of the decoupling capacitor, and the decoupling capacitor is no more than 70 microns from the integrated circuit element it is supporting. An off-chip decoupling capacitor is typically a millimeter in distance from the circuit element it is supporting.

A disadvantage of stacking the decoupling capacitors over the metal lines is illustrated in FIG. 2. Ideally, on chip decoupling capacitors are strapped off less than every 10 microns. However, due to structural limitations inherent in the layout of the chip and package bumps, the area of copper line 35, which in this example is a $V_{cc}$ line, covered by the capacitor stack and particularly electrode 14 of the capacitor stack, can be much greater than metal contact 30 through the passivating layer to top electrode 14. In one embodiment, this long capacitor stack may create wings of top electrode that extend 75 microns from the strapping contact.

In one embodiment, both $V_{ss}$ contact 30 and $V_{cc}$ metal line 35 are made of copper, a highly conductive material. Top capacitor electrode 14 may be made of, for example, tantalum nitride (TaN), titanium nitride (TiN), or tungsten nitride (WN). These typical top electrode materials generally have a much higher resistivity than copper. In one embodiment, where the top electrode is tantalum nitride, the resistivity of the top electrode is typically about 250 micro-ohm per centimeter (μohm cm.). Copper typically has a resistivity of 2 μohm cm. This change in resistivity can lead to an RC time constant loss as distant areas of the capacitor stack, say for example at point B of FIG. 2, require longer time to charge and discharge than areas of the capacitor stack near a conductive material, say for example point A.

The distance between points A and B in the top electrode shown in FIG. 2 is the distance over which a current has to travel to extract the charge at point B. This distance is called the strapping distance, W. This distance can be, in some instances, as much as 75 microns. The capacitance built up at point B then has to travel to point A in the relatively high resistivity top electrode 14 to contribute its charge. A time constant τ, is equivalent to RC (resistance times capacitance) in a RC circuit. RC is a rough measure of the time it would take to charge a capacitor through the distance from a constant voltage supply. R in this circuit is proportional to the distance between point A and point B or W, as is C. Thus τ is proportional to the square of the strapping distance, W. In the embodiment where the strapping distance is increased from about 10 microns to about 75 microns, the time constant increases by the square of the increase in distance of 7.5 to about 56, this would roughly translate to a delay of 10 nanosecond (nsec) or a maximum response frequency of 100

MHz. This increase in the time constant necessitates a reduction in the frequency of operation the decoupling capacitors may support.

BRIEF DESCRIPTION OF THE DRAWINGS

The claims are illustrated by way of example, and not limitation in the figures of the accompanying drawings, in which:

DETAILED DESCRIPTION OF THE INVENTION

An apparatus and method for fabricating a top electrode barrier for an off-die decoupling capacitor is disclosed. Reference will now be made to drawings wherein like structures will be provided with like reference designations. In order to show the structures of the claims more clearly, the drawings included herein are diagrammatic representations of integrated circuit structures. Thus, the actual appearance of the fabricated structures, for example in a photomicrograph, may appear different while still incorporating essential structures of the claims. Moreover, the drawings show only the structures necessary to understand the claims. Additional structures known in the art have not been included to maintain the clarity of the drawings.

Figure 1:
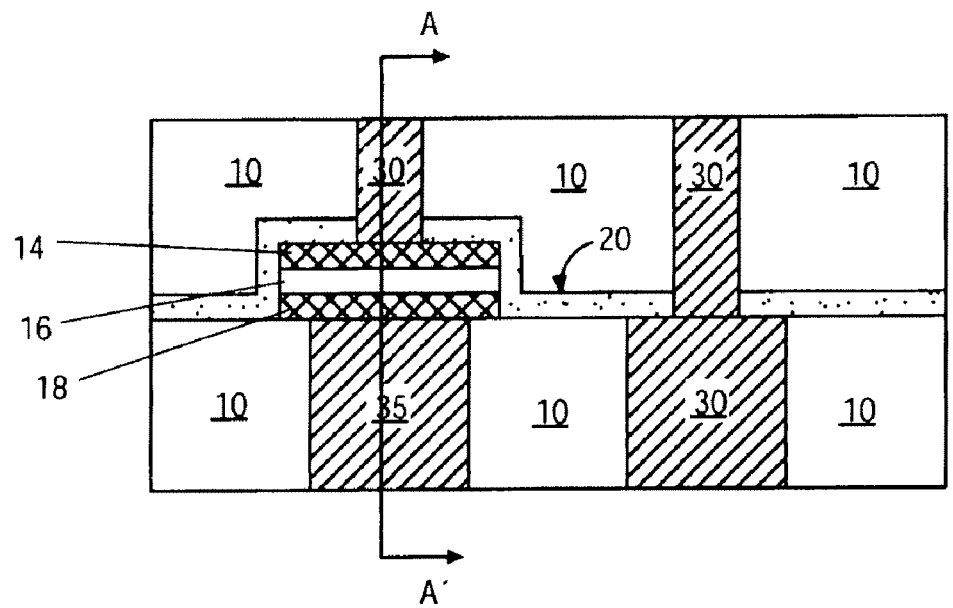
FIG. 1 is a cross-sectional schematic illustration of a decoupling capacitor stack placed on top of the metal line.
Figure 2:
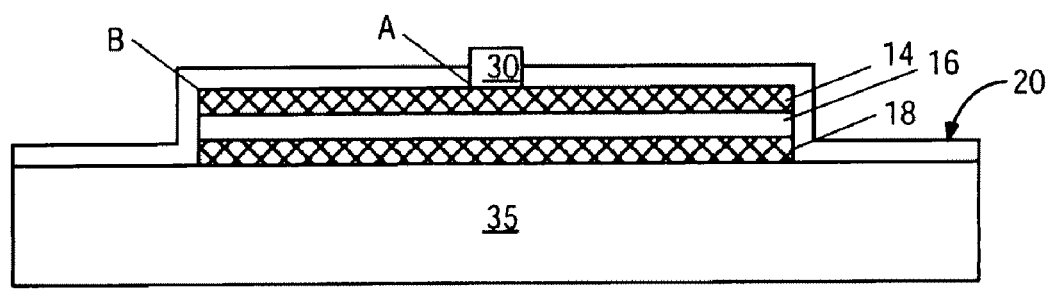
FIG. 2 is a cross-sectional schematic illustration the decoupling capacitor placed on the metal line of FIG. 1 seen through line A-A'.
Figure 3:
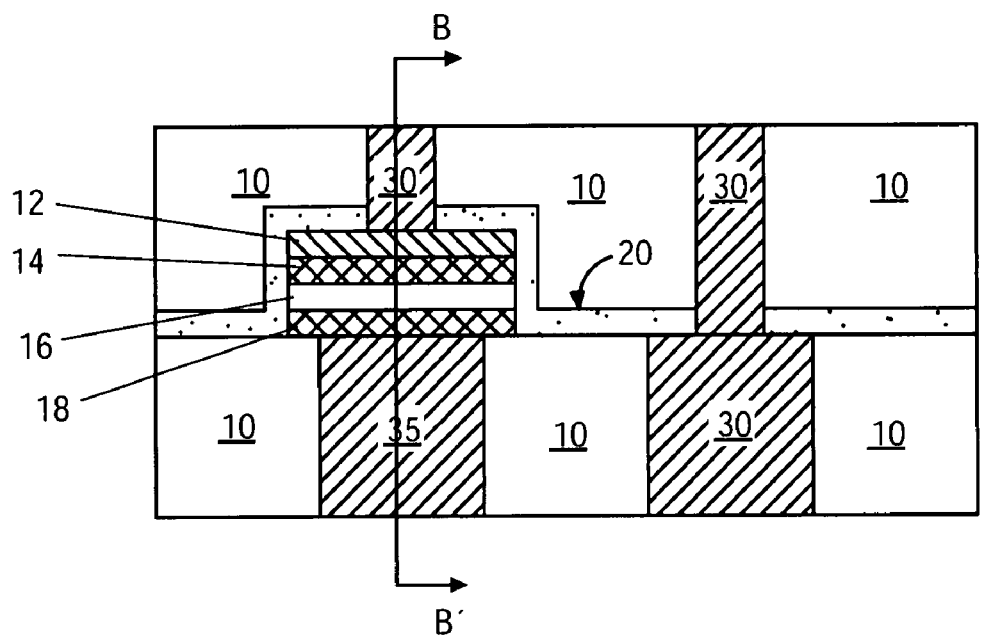
FIG. 3 is a schematic cross-sectional illustration of a decoupling capacitor with a top electrode barrier.

FIG. 3 is an illustration of one embodiment of a substrate such as a semiconductor (silicon) substrate having a decoupling capacitor stack on a metal layer, the capacitor stack having a top electrode barrier 12 on top electrode 14 of the decoupling capacitor stack. $V_{cc}$ metal line 35 is planarized and a blanket bottom electrode deposition 18 is laid on a surface thereof. The blanket bottom electrode deposition 18 has a high k material 16 deposited on top of it. Examples include silicon nitride (SiN), k=8; tantalum pentoxide ($Ta_2O_5$) k=25 or boron strontium titanate (BST) k=300. Finally, on top of high k material 16, a top electrode material 14 is deposited. Bottom electrode 18, high k material 16, and top electrode 14, form a decoupling capacitor that allows $V_{cc}$ metal line 35 to be decoupled. Typically, bottom electrode 18 and top electrode 14 may be fabricated from a metal nitride compound.

Typical compounds for use as the metal nitride for the top and bottom electrodes of the decoupling capacitor include, but are not limited to, tantalum nitride (TaN), titanium nitride (TiN), and tungsten nitride (WN). Top electrode barrier 12 will generally be, for ease of fabrication purposes, the metal from the metal nitride compound mentioned above. So, for example, if the top and bottom electrodes were made of tantalum nitride, the top electrode barrier would be made of tantalum. This use of a metal nitride metal system to place the top electrode barrier on the surface of the top electrode (as viewed) allows the deposition to be done in a single chamber. Top electrode 14 and top electrode barrier 12 form a highly adhesive interface, and typically the two materials will have similar etch characteristics. Typically, the transition from depositing a metal nitride to a metal can be accomplished by either a reduction in the radio frequency (RF) power of the deposition tool or a reduction in the partial pressure of the nitrogen in the chamber.

Figure 4:
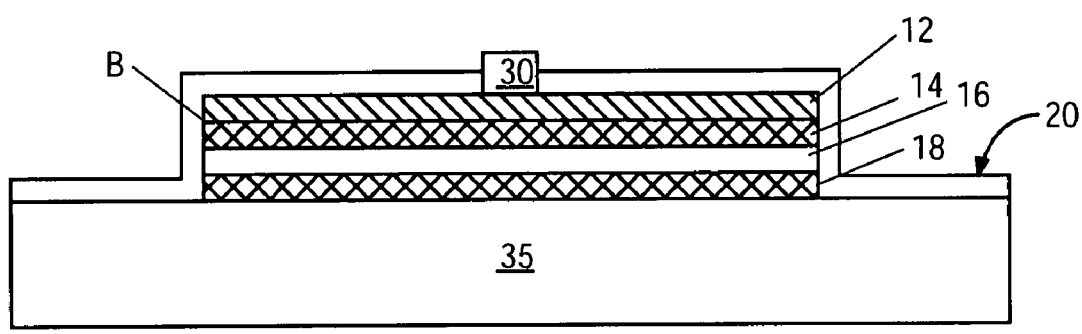
FIG. 4 is the decoupling capacitor stack on the metal line 35 with the top electrode barrier of FIG. 1 seen through line B-B'.

FIG. 4 illustrates the embodiment from FIG. 3 as seen from a 90° angle to better show the strapping length involved. In one embodiment, where the metal line is made out of copper and the metal nitride metal system is tantalum nitride, the resistivity of copper is typically 2 μohm cm., the resistivity of tantalum is typically 13 μohm cm., and the resistivity of tantalum nitride is typically 250 μohm cm. Thus, the top electrode barrier provides approximately a factor of 20 reduction in resistivity reducing the RC capacitor time constant. Hence, the use of top barrier electrode 12 effectively increases the maximum response frequency from 100 MHz to 2 GHz.

Figure 5:
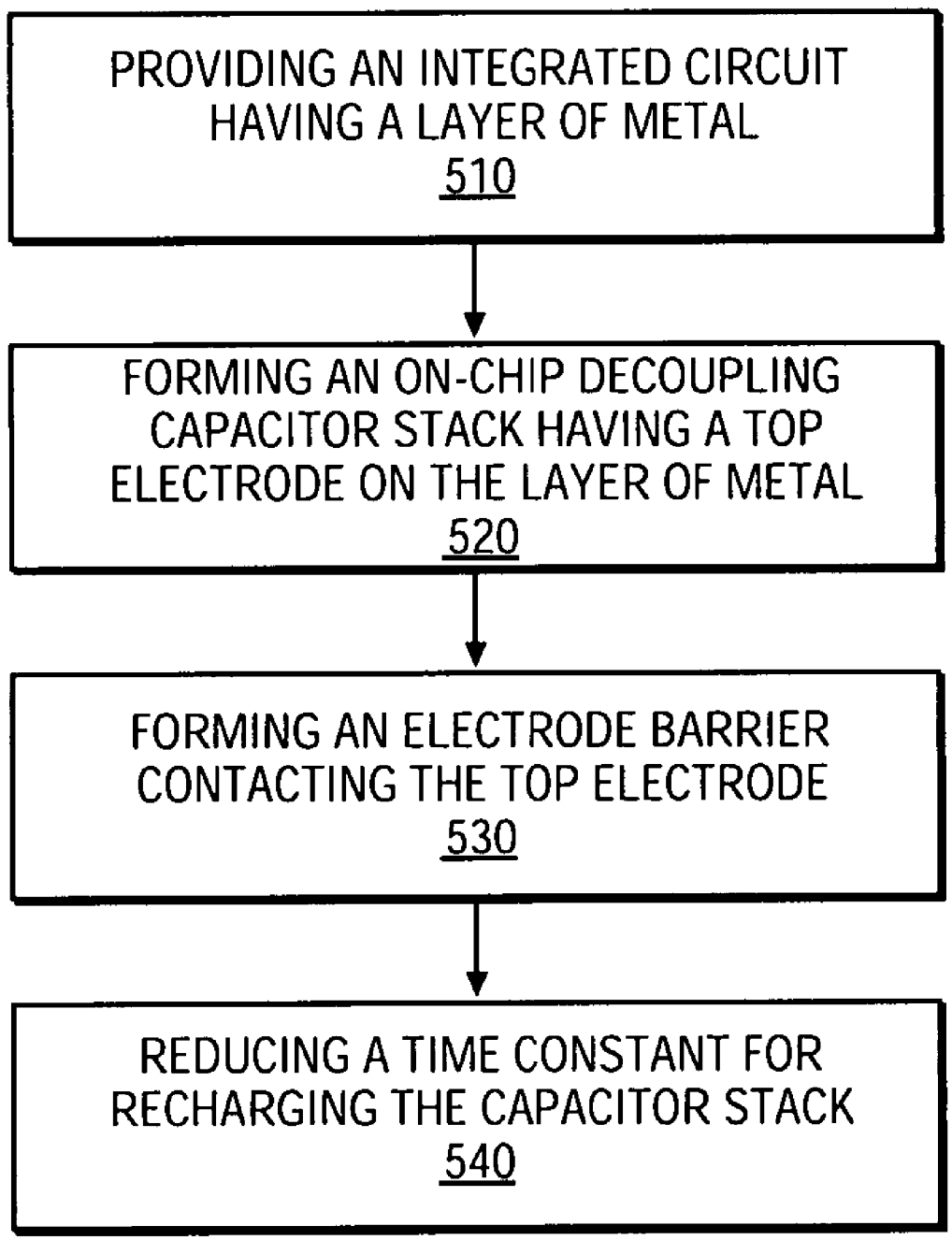
FIG. 5 is a flow diagram representing one method of fabricating one embodiment of the top electrode barrier.

FIG. 5 is a flow diagram representation of one method of fabricating an embodiment of the top electrode barrier. An integrated circuit is provided in block 510. In one embodiment, the integrated circuit has a top layer metal including an interlayer dielectric (ILD). The metal layer may be made of, but is not limited to, copper. The ILD may be formed from, but is not limited to, Plasma Tetra Ethyl Ortho Silicate (PTEOS). This metal layer is planarized to give the copper and ILD a smooth single surface.

An on chip decoupling capacitor stack is formed on the top metal layer at block 520 of FIG. 5. In one embodiment, the on chip decoupling capacitor stack comprises a bottom electrode, a high k dielectric layer and a top electrode with a top electrode barrier.

In one embodiment, the capacitor is formed by depositing a blanket layer of bottom electrode on the planarized top metal layer. The bottom electrode may be, but is not limited to TaN, TiN and WN. The bottom electrode may comprise a conductive barrier metal, which prevents oxidation and diffusion of copper during the deposition of a high k material, as well as subsequent process steps. Then a bottom electrode material may be deposited on the conductive barrier layer. The bottom electrode material will not oxidize during the deposition of the high k dielectric material. Deposition of the bottom conductive barrier material and the bottom electrode may be combined into one film, or if there is no degradation involved with direct high k deposition onto Cu, this bottom barrier/electrode component can be omitted.

After depositing the bottom electrode, a high k dielectric material is blanket deposited over the bottom electrode layer. The high k dielectric material may be but is not limited to tantalum pentoxide ($Ta_2O_5$).

The top electrode is deposited over the high k dielectric layer. The top electrode may be, but is not limited to TaN, TiN and WN. Deposition of this metal nitride material will inhibit oxidation during later process steps. Deposition of the top electrode may be followed by same chamber deposition of Tantalum (Ta), Titanium (Ti) and Tungsten (W). The metal deposition over the metal nitride layer forms the conductive top electrode barrier. This barrier will reduce the resistance of the top electrode and the strapping distance as discussed above. The deposition of one of these metal nitride materials may transition to the deposition of just the metal by either a reduction in the RF power applied to the deposition, or a reduction in the back pressure of nitrogen in the deposition chamber. The transition forms a metal nitride/metal interface between the top electrode and top electrode barrier layer. Deposition of the top electrode barrier is shown in block 530 of FIG. 5.

Processing the decoupling capacitor continues by applying and patterning a layer of photoresist. The photoresist is patterned to cover those areas of the metal layer where it is desired to retain the decoupling capacitor stacks. The capacitor stack is etched through, and the etch stops on the copper ILD layer. The photoresist mask is removed with a copper neutral photoresist stripper. A thin passivating layer is deposited over the capacitor stack, which includes a top electrode conductive barrier, and the exposed copper and ILD. The passivating layer may be made of, but is not limited to, silicon nitride ($Si_3N_4$). The passivating layer is patterned and etched to open contact openings to the top electrode barriers and copper vias.

Fabrication of the top electrode barrier as described above allows a reduction in the time constant for recharging the decoupling capacitor stack as shown in block 540 of FIG. 5. Inclusion of the top electrode barrier on the top electrode of the capacitor stack greatly reduces the time constant RC and enhances the ability of the capacitor stack to decouple and reduce the highest possible frequency noise.

In one embodiment, where the high k material will not react with the metal layer, the high k material, in one example a silicon nitride material, may be blanket deposited on the metal layer. A top electrode may then be deposited on the high k material layer. Not only does this eliminate the bottom electrode deposition step, but the top electrode/high k etch can stop anywhere in the high k layer without causing shorting between copper metal layer lines, since there is no blanket bottom electrode to remove. This has benefits of simplified processing in that there is greater etch control for the high k material etch, and an oxidizing photoresist ash step may be preformed after the high k etch because the copper will be covered by the blanket high k material deposition.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
   a decoupling capacitor comprising a high k material layer and top electrode formed as a stack wherein
   a planarized metal line is coupled to the bottom of the high k layer of the decoupling capacitor, wherein the top electrode of the decoupling capacitor has a surface that forms an interface with a top electrode barrier, wherein the top electrode is a metal nitride and the top electrode barrier is a metal, and wherein the interface is metal nitride/metal interface between the metal nitride and the metal.

2. The apparatus of claim 1, further comprising:
   a bottom electrode formed between the metal line and the high k layer.

3. The apparatus of claim 2, wherein the top electrode barrier comprises a material that is more electrically conductive than a material for the top electrode.

4. The apparatus of claim 2, wherein the planarized metal line comprises a material that is more electrically conductive than the material for the bottom electrode.

5. The apparatus of claim 2, wherein the high k material layer is a planar blanket layer; wherein the top electrode is a planar blanket layer; wherein the top electrode barrier is a planar blanket layer; and wherein the bottom electrode is a planar blanket layer.

6. The apparatus of claim 5, wherein the interface is only formed above and on the high k material layer.

7. The apparatus of claim 1, wherein the top electrode comprises one of tantalum nitride (TaN), titanium nitride (TiN) and tungsten nitride (WN).

8. The apparatus of claim 1, wherein the top electrode barrier is one of tantalum (Ta), titanium (Ti) and tungsten (W).

9. The apparatus of claim 1, wherein the top electrode comprises a metal nitride and the top electrode barrier comprises a metal that is the same metal as the metal of the metal nitride.

10. The apparatus of claim 9, wherein the top electrode is formed on the high k material and the barrier is formed on the top of the electrode in a single deposition chamber without removing the on chip decoupling capacitor stack from the single deposition chamber.

11. The apparatus of claim 1, wherein the top electrode barrier material comprises one of tantalum (Ta), titanium (Ti) and tungsten (W).

12. The apparatus of claim 1, wherein the barrier comprises one less element than the top electrode, and wherein the dielectric material has a high k material constant of greater than about ten.

13. The apparatus of claim 1, wherein the interface comprises a highly adhesive interface, and wherein the top electrode metal nitride inhibits oxidation of the high k material layer, reduces resistance of the top electrode, and reduces strapping distance of the top electrode.

14. An apparatus comprising:
   an integrated circuit having a metal layer; and
   an electrically decoupling capacitor stack coupled to the metal layer, the electrically decoupling capacitor stack having a top electrode wherein the top electrode has a surface that forms an interface with a top electrode barrier, wherein the top electrode is a metal nitride and the top electrode barrier is a metal, and wherein the interface is metal nitride/metal interface between the metal nitride and the metal.

15. The apparatus of claim 14, wherein the top electrode barrier is more electrically conductive than the top electrode.

16. The apparatus of claim 14, wherein the top electrode comprises one of Tantalum Nitride (TaN), Titanium Nitride (TiN) and Tungsten Nitride (WN).

17. The apparatus of claim 14, wherein the top electrode barrier is one of Tantalum (Ta), Titanium (Ti) and Tungsten (W).

18. The apparatus of claim 14, wherein the top electrode comprises a metal nitride and the top electrode barrier comprises a metal that is the same metal as the metal of the metal nitride.

19. The apparatus of claim 18, wherein the top electrode is formed on a dielectric layer and the top electrode barrier is formed on the top of the electrode in a single deposition chamber without removing the integrated circuit stack from the single deposition chamber.

20. The apparatus of claim 19, wherein the top electrode barrier comprises one less element than the top electrode, and wherein the dielectric material has a dielectric constant of greater than about ten.

* * * * *